United States Patent
Nakanishi et al.

(10) Patent No.: US 7,491,937 B2
(45) Date of Patent: Feb. 17, 2009

(54) TWO-WAVELENGTH IMAGE SENSOR PICKING UP BOTH VISIBLE AND INFRARED IMAGES

(75) Inventors: Junji Nakanishi, Chiyoda-ku (JP); Daisuke Takamuro, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/695,302

(22) Filed: Apr. 2, 2007

(65) Prior Publication Data

US 2007/0284532 A1    Dec. 13, 2007

(30) Foreign Application Priority Data

Jun. 13, 2006   (JP) .............................. 2006-163405

(51) Int. Cl.
  *H01L 25/00*   (2006.01)
(52) U.S. Cl. .................................................... 250/332
(58) Field of Classification Search ................. 250/332; 358/44
  See application file for complete search history.

(56) References Cited

U.S. PATENT DOCUMENTS

| | | | |
|---|---|---|---|
| 4,679,068 A | * | 7/1987 | Lillquist et al. ............... 348/33 |
| 5,093,563 A | * | 3/1992 | Small et al. ............... 250/201.9 |
| 5,126,554 A | * | 6/1992 | Ranson ........................ 250/216 |
| 6,307,194 B1 | * | 10/2001 | Fitzgibbons et al. ...... 250/208.1 |
| 7,247,851 B2 | * | 7/2007 | Okada et al. ........... 250/339.02 |
| 2003/0001093 A1 | * | 1/2003 | Wood .......................... 250/332 |

FOREIGN PATENT DOCUMENTS

| | | |
|---|---|---|
| JP | 11-289492 | 10/1999 |
| JP | 2004-531740 | 10/2004 |
| JP | 2005-51791 | 2/2005 |
| WO | WO 03/002962 A1 | 1/2003 |

* cited by examiner

*Primary Examiner*—David P Porta
*Assistant Examiner*—Kiho Kim
(74) *Attorney, Agent, or Firm*—Oblon, Spivak, McClelland, Maier & Neustadt, P.C.

(57) ABSTRACT

A 2-wavelength image sensor has a plurality of uniformly dispersedly arranged visible radiation detectors and a plurality of uniformly dispersedly arranged, uncooled infrared radiation detectors, and a single visible radiation detector configures a visible radiation detecting pixel and four series connected infrared radiation detectors configure a thermal infrared radiation detecting pixel. Consequently a visible image can be four times a thermal image in resolution. Furthermore for an infrared image an area increased four times per pixel to receive light can be achieved. As a result the infrared image can be enhanced in temperature resolution.

10 Claims, 9 Drawing Sheets

TWO-WAVELENGTH IMAGE SENSOR PICKING UP BOTH VISIBLE AND INFRARED IMAGES

BACKGROUND OF THE INVENTION

1. Field of the Invention

The present invention relates generally to 2-wavelength image sensors and particularly to 2-wavelength image sensors picking up both visible and infrared images.

2. Description of the Background Art

An optical sensor system utilized in the field of security for detecting human bodies can be improved in performance for detection by combining picking up a visible image and picking up an infrared image. One such sensor system conventionally used is a sensor system that simply combines the two pickup systems of a camera for visible radiation and an infrared camera. However, such a system is large in size and requires a complicated image process between two types of optical images to analyze data. Accordingly there has been a demand for a sensor system capable of picking up both types of images with a single camera.

In connection therewith there has been proposed a 2-wavelength image sensor capable of picking up a visible image and a thermal image with a single chip. For example, Japanese Patent Laying-Open No. 11-289492 discloses an infrared image sensor employing a PtSi Schottky diode as a detector with a PtSi layer provided in a thin film to also have a function to detect visible radiation. An optical sensor system employing this image sensor has a spectroscopic filter exchanged to employ picking up a visible image and picking up an infrared image, as required.

Furthermore a typical color image sensor employing a Si photodiode in a photodetector is capable of picking up a near infrared image, which is not a thermal infrared image, and a visible image. On the photodiode a spectroscopic filter is provided to allow an image for light different in wavelength, such as blue, green, red, near infrared, to be picked up with a single chip. For example, Japanese Patent Laying-Open No. 2005-051791 discloses a color image sensor picking up visible to near infrared images that defines how a color (i.e., a spectroscopic filter provided on a detector) is arranged to allow a near infrared image to be higher in resolution than a visible image.

Generally for an optical sensor system utilizing both visible and thermal infrared images the resolution required by one image is different from that required by the other. More specifically, for the visible image, it is desirable to provide an increased resolution to pick up the image in detail, whereas for the thermal image, while resolution may somewhat be low, high sensitivity (or temperature resolution) is desired.

The image sensor disclosed in Japanese Patent Laying-open No. 11-289492, however, detects visible radiation and infrared radiation with a single detector and it is inevitable that the visible image and the thermal image are disadvantageously the same in resolution. Furthermore the single detector prevents picking up the visible image and the thermal infrared image simultaneously. Furthermore the detector must be cooled to approximately −200° C. or lower. As a result the system is increased in size and cost for production.

The image sensor disclosed in Japanese Patent Laying-open No. 2005-051791 allows two types of images to be different in resolution, i.e., can increase the resolution of the near infrared image to be higher than that the visible image. However, the image sensor has near infrared pixels higher in resolution distributed thinned out in arrangement. Accordingly it requires pixel interpolation to obtain a complete image.

SUMMARY OF THE INVENTION

The present invention mainly contemplates a 2-wavelength image sensor that can obtain a visible image high in resolution and an infrared image high in sensitivity, pick up the images simultaneously, eliminate the necessity of being cooled, and dispense with pixel interpolation or a similar image process.

The present 2-wavelength image sensor picks up both a visible image and an infrared image. It includes a detector array including a plurality of visible radiation detectors and a plurality of uncooled infrared radiation detectors. The plurality of visible radiation detectors and the plurality of uncooled infrared radiation detectors are uniformly dispersedly arranged. Each of the visible radiation detectors configures a single pixel of the visible image. The plurality of uncooled infrared radiation detectors are divided into groups of N of the uncooled infrared radiation detectors, N being an integer of at least two. Each of the groups has the N uncooled infrared radiation detectors series connected to configure a single pixel of the infrared image.

The present 2-wavelength image sensor allows a single pixel of a visible image to be configured of a single visible radiation detector and a single pixel of an infrared image to be configured of a plurality of infrared radiation detectors. The visible image can thus be higher in resolution than the infrared image. Furthermore the plurality of infrared radiation detectors configuring the single pixel of the infrared image can be series connected. This allows the infrared image to be enhanced in sensitivity. Furthermore, as the present 2-wavelength image sensor is provided with both a visible radiation detector and an uncooled infrared radiation detector, it can pick up a visible image and an infrared image simultaneously. Furthermore the uncooled infrared radiation detector needs not be cooled. Furthermore a plurality of visible radiation detectors and a plurality of uncooled infrared radiation detectors that are uniformly dispersedly arranged can provide an excellently uniform image without pixel interpolation or a similar image process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
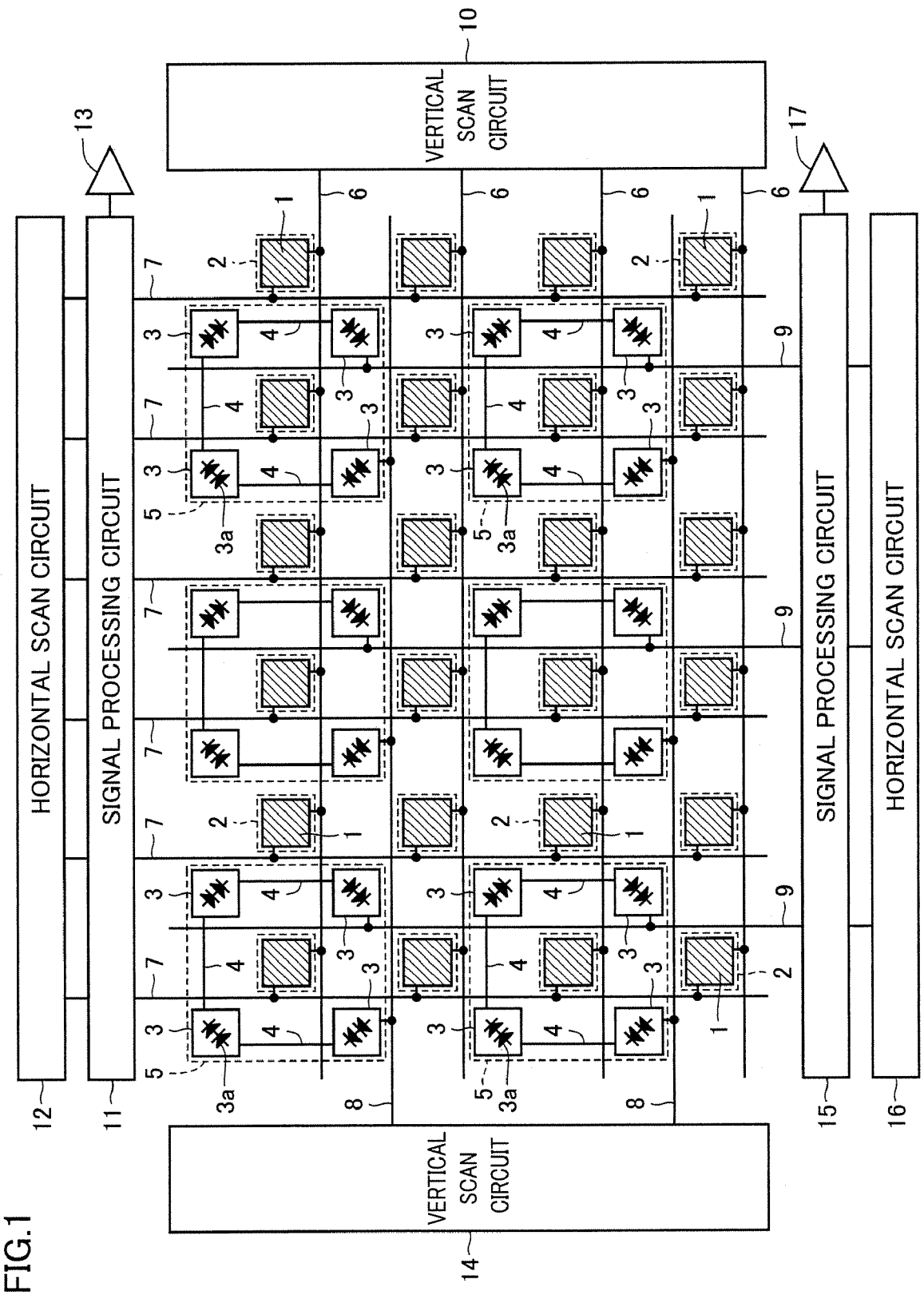
FIG. 1 is a plan view of a configuration of a 2-wavelength image sensor of the present invention in a first embodiment.

FIG. 1 is a plan view in configuration of the 2-wavelength image sensor of the present invention in a first embodiment. As shown in FIG. 1, the 2-wavelength image sensor includes a detector array including a plurality of visible radiation detectors 1 and a plurality of uncooled infrared radiation detectors 3. While in reality a large number of detectors 1 and 3 are provided, FIG. 1 shows 24 detectors for each type of detector for simplicity. Twenty four visible radiation detectors 1 and 24 uncooled infrared radiation detectors 3 are uniformly dispersedly arranged. More specifically, 24 visible radiation detectors 1 are arranged in four rows and six columns with a predetermined pitch and so are 24 uncooled infrared radiation detectors 3, and visible radiation detectors 1 and uncooled infrared radiation detectors 3 are displaced by a half pitch in the direction of the rows and that of the columns.

Visible radiation detector 1 is implemented by a Si pn junction photodiode and cooperates with a transistor group for reading a signal to configure a visible radiation detecting pixel 2. Along each row of visible radiation detecting pixels 2 a horizontal select line 6 is arranged and along each column of visible radiation detecting pixels 2 a vertical signal line 7 is arranged. Each visible radiation detecting pixel 2 is connected to horizontal select line 6 of the row corresponding thereto and vertical signal line 7 of the column corresponding thereto. Horizontal select line 6 has one end connected to a vertical scan circuit 10 and vertical signal line 7 has one end connected to a signal processing circuit 11 configured for example of a column amplifier group, and a horizontal scan circuit 12. Furthermore signal processing circuit 11 has one end connected to an output amplifier 13 for visible radiation.

Vertical scan circuit 10 in picking up a visible image selects a plurality of (in the figure, four) horizontal select lines 6, each for a predetermined period of time, sequentially and sets the selected horizontal select lines 6 at a selected level. When horizontal select line 6 is set at the selected level, visible radiation detecting pixel 2 connected to horizontal select line 6 selected is activated, and vertical signal line 7 connected to visible radiation detecting pixel 2 activated varies in potential to a level corresponding to an amount of visible radiation incident on visible radiation detecting pixel 2 activated. Horizontal scan circuit 12 selects a plurality of (in the figure, six) vertical signal lines 7 each for a predetermined period of time sequentially while vertical scan circuit 10 selects a single one of horizontal select lines 6. Signal processing circuit 11 reads the potential of vertical signal line 7 selected by horizontal scan circuit 12. Output amplifier 13 amplifies and outputs the potential of vertical signal line 7 read by signal processing circuit 11.

Twenty four uncooled infrared radiation detectors 3 are divided in groups of four detectors and four uncooled infrared radiation detectors 3 of each group are arranged in two rows and two columns to surround a single visible radiation detecting pixel 2 and electrically connected by a metal interconnection 4 in series to form a thermal infrared radiation detecting pixel 5. Thus six thermal infrared radiation detecting pixels 5 are provided, and the six pixels 5 are arranged in two rows and three columns. Each uncooled infrared radiation detector 3 includes two series connected SOI diodes 3a as a temperature sensor for an infrared radiation absorbing umbrella structure. Thus each thermal infrared radiation detecting pixel 5 includes eight series connected SOI diodes 3a.

Along each row of thermal infrared radiation detecting pixels 5 a horizontal select line 8 is arranged and along each column of thermal infrared radiation detecting pixels 5 a vertical signal line 9 is arranged, and each thermal infrared radiation detecting pixel 5 is connected to horizontal select line 8 of the row corresponding thereto and vertical signal line 9 of the column corresponding thereto. Horizontal select line 8 has one end connected to a vertical scan circuit 14 and vertical signal line 9 has one end connected to a signal processing circuit 15 configured for example of a column amplifier group, and a horizontal scan circuit 16. Furthermore signal processing circuit 16 has one end connected to an output amplifier 17 for infrared radiation.

Vertical scan circuit 14 in picking up an infrared image selects a plurality of (in the figure, two) horizontal select lines 8 each for a predetermined period of time sequentially and sets the selected horizontal select lines 8 at a selected level. When horizontal select line 8 is set at the selected level, infrared radiation detecting pixel 5 connected to horizontal select line 8 selected is activated, and vertical signal line 9 connected to infrared radiation detecting pixel 5 activated varies in potential to a level corresponding to an amount of infrared radiation incident on infrared radiation detecting pixel 5 activated. Horizontal scan circuit 16 selects a plurality of (in the figure, three) vertical signal lines 9 each for a predetermined period of time sequentially while vertical scan circuit 14 selects a single one of horizontal select lines 8. Signal processing circuit 15 reads the potential of vertical signal line 9 selected by horizontal scan circuit 16. Output amplifier 17 amplifies and outputs the potential of vertical signal line 9 read by signal processing circuit 15.

Figure 2:
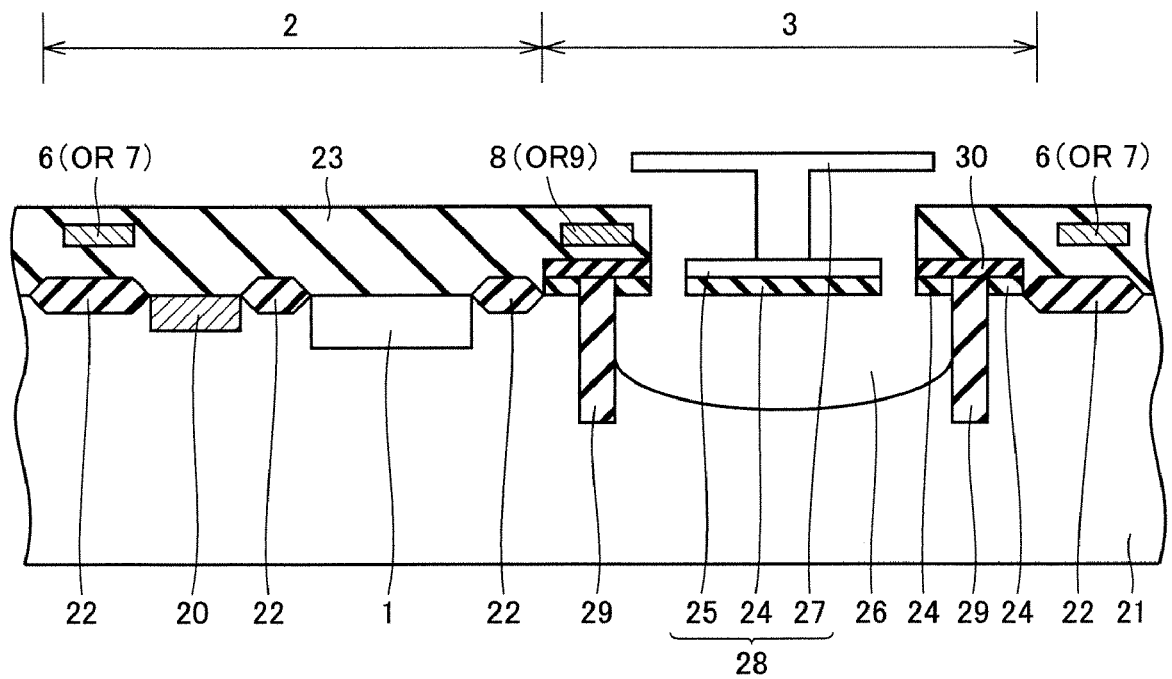
FIG. 2 is a cross section in configuration of a visible radiation detecting pixel and an infrared radiation detector shown in FIG. 1.

FIG. 2 is a cross section in configuration of visible radiation detecting pixel 2 and infrared radiation detector 3 adjacent to each other. In the first embodiment is used infrared radiation detector 3 employing an SOI diode. Accordingly, an SOI substrate is used. Visible radiation detecting pixel 2 has visible radiation detector (or photodiode) 1 and a read circuit 20 formed of a transistor group for reading a signal, provided in a surface of bulk silicon 21 of the SOI substrate and isolated from each other by a field oxide film 22. Read circuit 20 has one end connected to visible radiation detector 1 and the other end connected to horizontal select line 6 or vertical signal line 7. Furthermore, visible radiation detecting pixel 2 has a surface provided with a dielectric film 23.

Infrared radiation detector 3 is fabricated by Si micromachine technology. The SOI substrate has an SOI layer 25 on a BOX oxide film 24, and on the layer two series connected SOI diodes 3a are provided and bulk silicon 21 immediately thereunder is removed to form a gap 26. Thus over SOI layer 25 an infrared radiation absorbing umbrella structure 27 is formed. BOX oxide film 24, SOI layer 25 and infrared radiation absorbing umbrella structure 27 together configure a hollow structure 28, which is held by a supporting leg (not shown) small in thermal conductance. A trench isolation oxide film 29 is a stopper that stops etching in forming gap 26 and formed to surround hollow structure 28. Furthermore to isolate an element a field oxide film 30 of SOI layer is provided. Furthermore, SOI diodes 3a series connected have a positive terminal connected to horizontal select line 8 and a negative terminal to vertical signal line 9.

Figure 3:
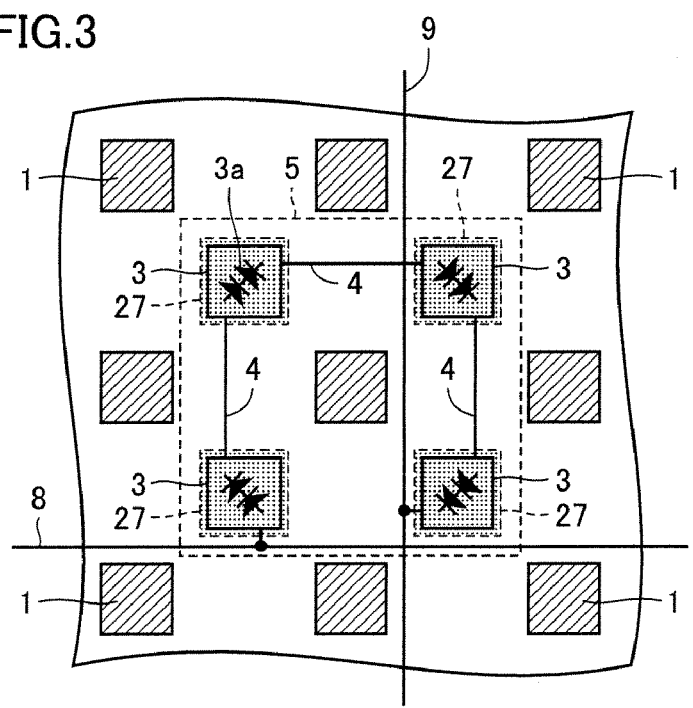
FIG. 3 is a plan view showing a layout of an infrared radiation absorbing umbrella structure shown in FIG. 2.

FIG. 3 is a plan view showing a layout of infrared radiation absorbing umbrella structure 27 of infrared radiation detector 3. In FIG. 3 thermal infrared radiation detecting pixel 5 is configured of four infrared radiation detectors 3 each provided with infrared radiation absorbing umbrella structure 27 independently. When infrared radiation absorbing umbrella structure 27 receives thermal infrared radiation, infrared radiation absorbing umbrella structure 27 increases in temperature in accordance with the amount of the thermal infrared radiation incident thereon. Accordingly the amount of the thermal infrared radiation incident thereon can be detected by detecting the temperature of infrared radiation absorbing umbrella structure 27.

The 2-wavelength image sensor operates, as will be described hereinafter. First will be described how it operates when it picks up a visible image. When, of light incident on the image sensor, visible, near infrared light is incident on visible radiation detecting pixel 2 at visible light detector 1, visible radiation detecting pixel 2 outputs a potential varying with the amount of the light incident on the detector. When vertical scan circuit 10 selects a single horizontal select line 6, vertical signal line 7 varies in potential with each output of visible radiation detecting pixels 2 of a single row connected to the single horizontal select line 6 selected. A column amplifier located in signal processing circuit 11 provided at an end of vertical signal line 7 amplifies a variation in potential of each vertical signal line 7 and an output of a column amplifier selected by horizontal scan circuit 12 is output from output amplifier 13 for visible radiation. Vertical scan circuit 10 and horizontal scan circuit 12 operate to scan to read in time series an output of a detector of visible radiation detecting pixel 2 arranged in a matrix. A two dimensional visible image is thus obtained.

The image sensor in picking up a thermal infrared image operates, as described hereinafter. Uncooled infrared radiation detector 3 is also referred to as a bolometric detector and configured of thermal insulation structure fabricated by Si micromachine technology and a thermoelectric conversion element overlying the thermal insulation structure. When the thermal insulation structure receives infrared radiation, the thermal insulation structure absorbs the infrared radiation, and increases in temperature in accordance with the amount of infrared radiation incident thereon. How the structure varies in temperature is detected by the thermoelectric conversion element and output as a variation in potential. In contrast to a quantum infrared radiation detector, a bolometric detector is not required to be cooled to low temperature, and is thus capable of operation at normal temperature.

The present 2-wavelength image sensor employs a thermoelectric conversion element implemented by two series connected SOI diodes 3$a$. SOI diode 3$a$ has a current-voltage characteristic varying with temperature. For example if a constant current is passed, a difference in potential between opposites ends of diode 3$a$ decreases as temperature increases. If, of light incident on the image sensor, mid infrared radiation, far infrared radiation or the like is incident on thermal infrared radiation detecting pixel 5, each uncooled infrared radiation detector 3 internal to thermal infrared radiation detecting pixel 5 outputs a potential varying with the radiation incident. At the time, thermal infrared radiation detecting pixel 5 outputs a potential with a variation equal to a sum of those of potentials output from four infrared radiation detectors 3.

When vertical scan circuit 14 selects a single horizontal select line 8, vertical signal line 9 varies in potential with each output of thermal infrared radiation detecting pixels 5 of a single row connected to the single horizontal select line 8 selected. A column amplifier located in signal processing circuit 15 provided at an end of vertical signal line 9 amplifies a variation in potential of each vertical signal line 9 and an output of a column amplifier selected by horizontal scan circuit 16 is output from output amplifier 17 for infrared radiation. Vertical scan circuit 14 and horizontal scan circuit 16 operate to scan to read in time series an output of a detector of thermal infrared radiation detecting pixel 5 arranged in a matrix. A two dimensional thermal infrared image is thus obtained.

In the first embodiment a single pixel of a visible image is configured by a single visible radiation detector 1 and a single pixel of a thermal infrared image is configured by four infrared radiation detectors 3. As such, if each type of detector equal in number is arranged uniformly, the visible image will be four times the thermal image in resolution. Both detectors can be provided each in an arrangement which is perfectly periodical such that it is not thinned out. This can eliminate the necessity of pixel interpolation or similar, complicated signal processing to obtain an excellently uniform image. Furthermore, when a single pixel of a thermal infrared image that is formed of four infrared radiation detectors 3 connected in series is compared with that formed of a single infrared radiation detector 3, the former allows infrared radiation to be received over an area per pixel four times that of the latter. A thermal image improved in temperature resolution can thus be provided.

Furthermore visible radiation detector 1 and infrared radiation detector 3 can independently provide photodetection operation. This allows picking up a visible image and picking up an infrared image to be done completely separately. On the other hand, causing vertical scan circuit 10, 14 and horizontal scan circuit 12, 16 to scan synchronously allows the two types of images to be picked up simultaneously. The visible image and thermal infrared image thus obtained have a relationship such that their positions mutually match, pixel by pixel, if the sensor system has an optical system shared by the detectors. This can excellently effectively eliminate the necessity of performing complicated coordinate conversion between the two images for example if it is desired to extract a figure of a person through an image process.

Furthermore, an Si photodiode inherently operates at normal temperature, and visible radiation detector 1 and infrared radiation detector 3 both need not be cooled. The pickup system can thus be reduced in size and price.

Figure 4:
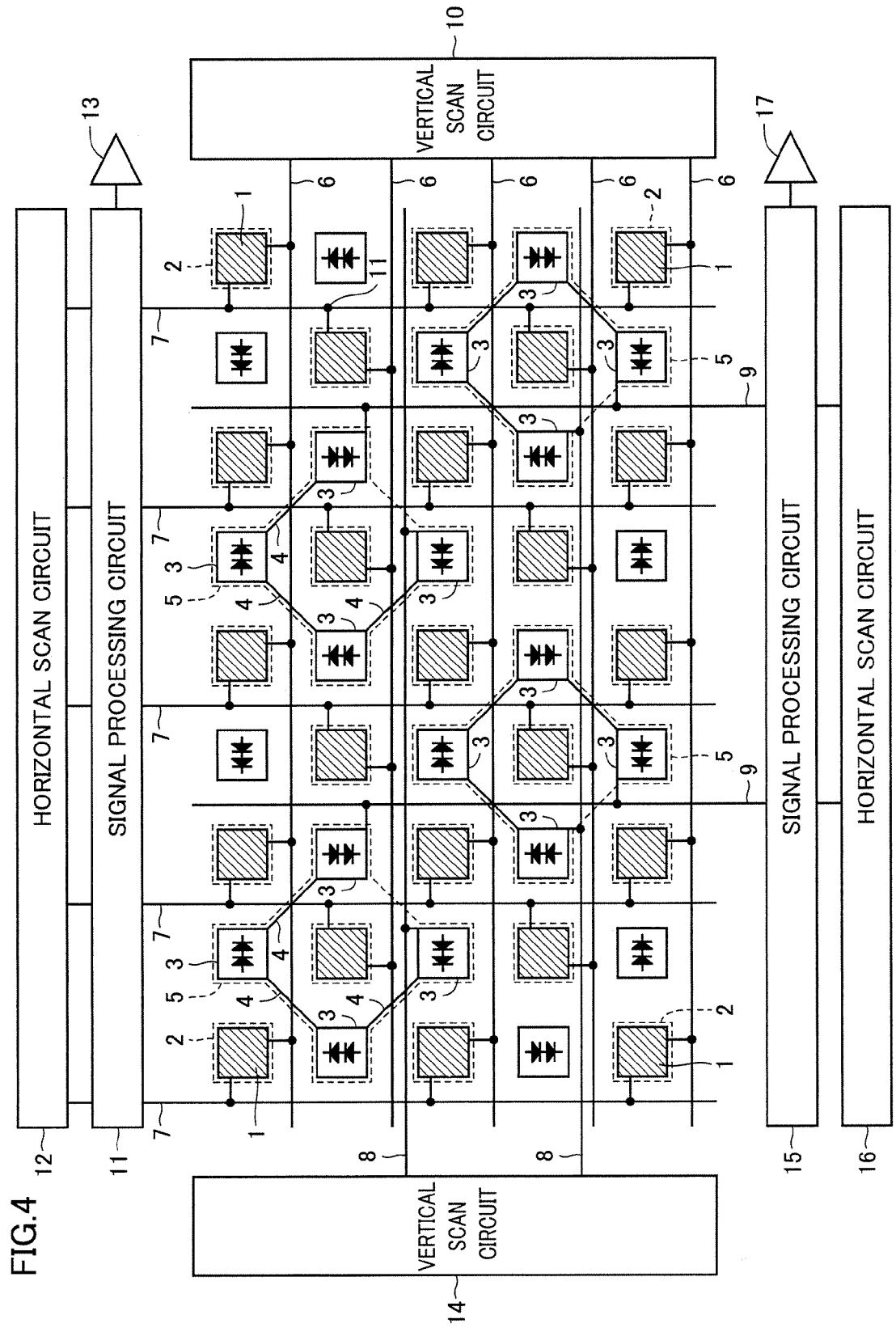
FIG. 4 is a plan view of an exemplary variation of the first embodiment.

FIG. 4 shows an exemplary variation of the first embodiment, as compared with FIG. 1. In FIG. 4 the 2-wavelength image sensor has visible radiation detector 1 and uncooled infrared radiation detector 3, arranged along a row and a column alternately. In FIG. 4, 23 visible radiation detectors 1 and 22 uncooled infrared radiation detectors 3 are arranged in five rows and nine columns. Visible radiation detector 1 cooperates with a signal reading transistor group (not shown) to configure visible radiation detecting pixel 2. Along each row horizontal select line 6 is arranged and along each odd numbered column vertical signal line 7 is arranged, and each visible radiation detecting pixel 2 is connected to horizontal select line 6 of the row corresponding thereto and vertical signal line 7 of the column corresponding thereto or an adjacent column.

The plurality of uncooled infrared radiation detectors 3 are divided in groups of four detectors and four uncooled infrared radiation detectors 3 of each group are arranged in three rows and three columns to surround a single visible radiation detecting pixel 2 and electrically connected by metal interconnection 4 in series to form a thermal infrared radiation detecting pixel 5. Thus four thermal infrared radiation detecting pixels 5 are provided, and the four pixels 5 are arranged in two rows and two columns. Along each row of thermal infrared radiation detecting pixels 5 horizontal select line 8 is arranged and along each column of thermal infrared radiation detecting pixels 5 vertical signal line 9 is arranged, and each thermal infrared radiation detecting pixel 5 is connected to horizontal select line 8 of the row corresponding thereto and vertical signal line 9 of the column corresponding thereto. The remainder in configuration and operation is identical to that of the first embodiment. Accordingly it will not be described repeatedly. This exemplary variation can also provide the same effect as the first embodiment.

Second Embodiment

Figure 5:
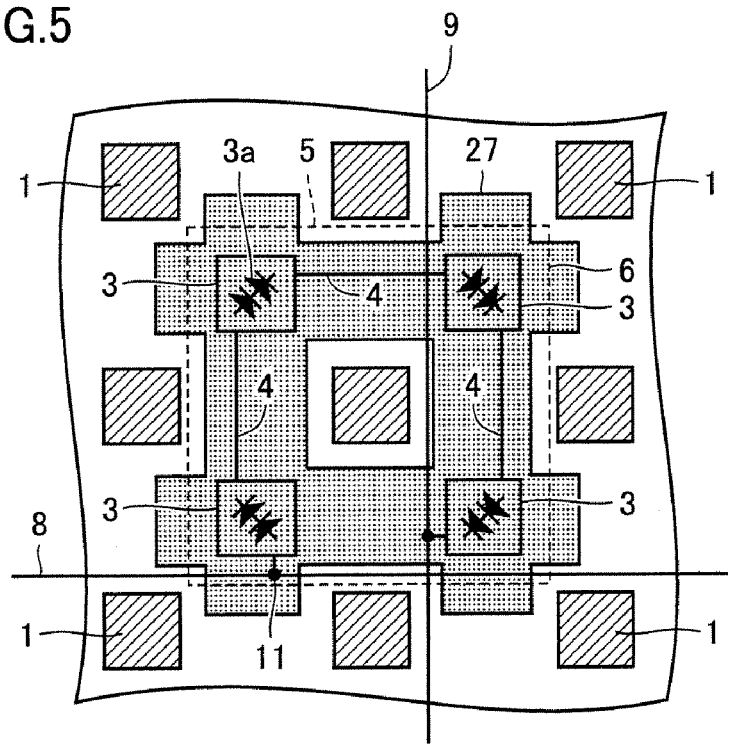
FIG. 5 is a plan view of a main portion of the 2-wavelength image sensor of the present invention in a second embodiment.
Figure 6:
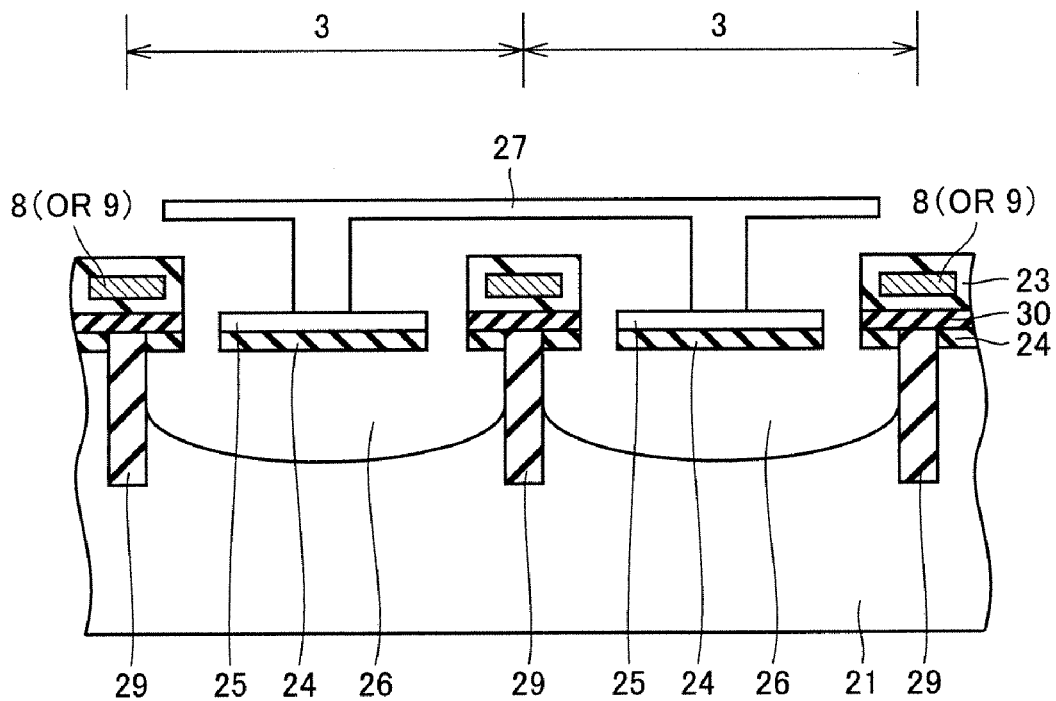
FIG. 6 is a cross section in configuration of two adjacent infrared radiation detectors shown in FIG. 5.

FIG. 5 is a plan view of a main portion of the present 2-wavelength image sensor in a second embodiment in comparison with FIG. 3, and FIG. 6 is a cross section in configuration of two adjacent infrared radiation detectors 3.

In FIGS. 5 and 6 the 2-wavelength image sensor has thermal infrared radiation detecting pixel 5 formed of four infrared radiation detectors 3 with their infrared radiation absorbing umbrella structure 27 integrally formed. Accordingly, four infrared radiation detectors 3 in a single thermal infrared radiation detecting pixel 5 are mutually thermally coupled. Accordingly, their respective hollow structures are equal in temperature. The value will be substantially a mean value of the temperatures of the four hollow structures that would be attained when they are thermally independent. The remainder in configuration and operation is identical to that of the first embodiment. Accordingly it will not be described repeatedly.

When the second embodiment is compared with the first embodiment, the former increases an area of infrared radiation absorbing umbrella structure 27 per pixel to be larger than the latter. This can provide an increased amount of infrared radiation received per pixel and hence an thermal image improved in temperature resolution.

Third Embodiment

Figure 7:
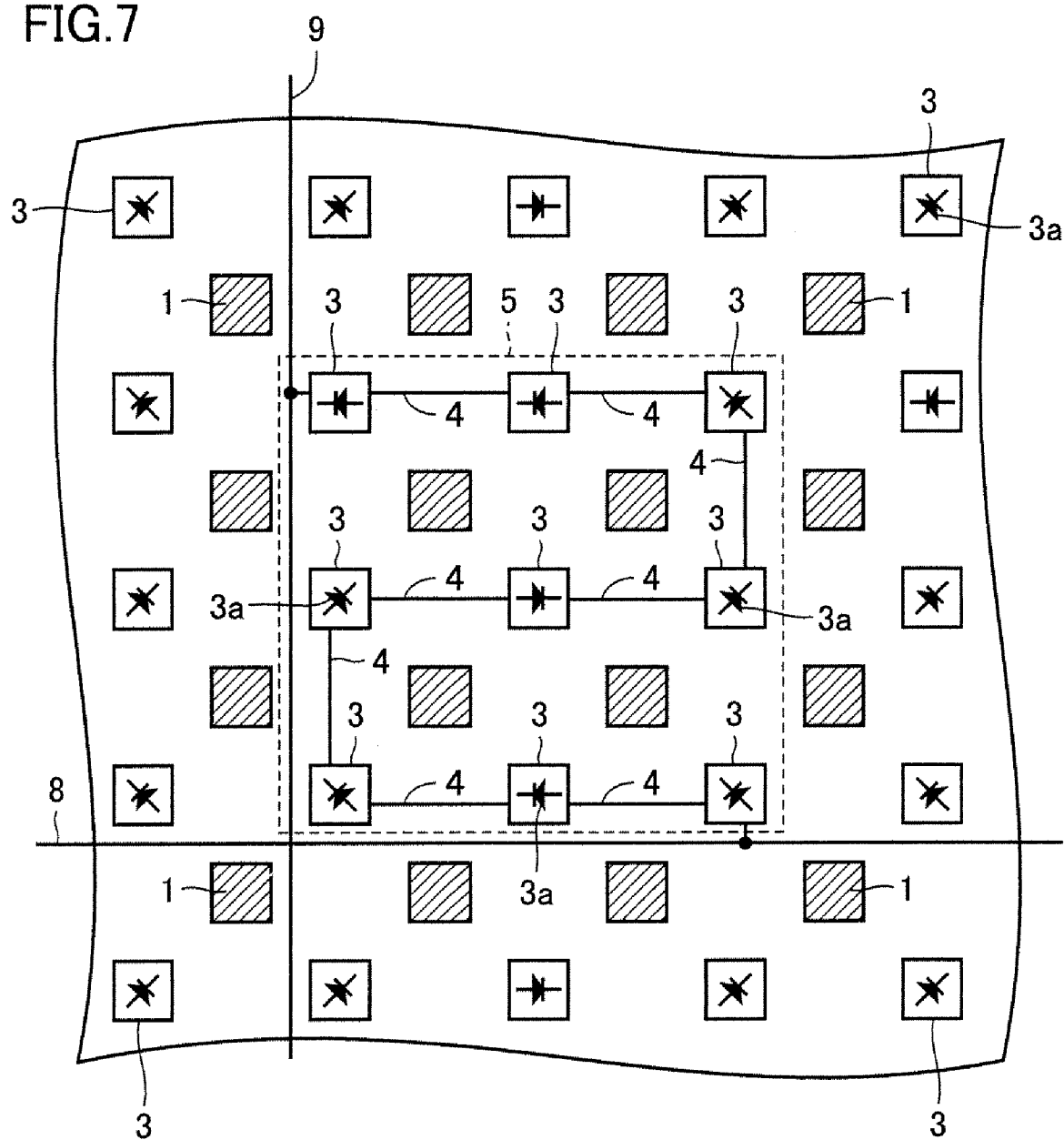
FIGS. 7-10 are plan views of main portions of the 2-wavelength image sensor of the present invention in third to sixth embodiments, respectively.

FIG. 7 is a plan view of a main portion of the present 2-wavelength image sensor in a third embodiment. In FIG. 7 the 2-wavelength image sensor has thermal infrared radiation detecting pixel 5 configured including nine uncooled infrared radiation detectors 3 arranged in three rows and three columns and eight metal interconnections 4 electrically connecting the nine infrared radiation detectors 3 in series. Each uncooled infrared radiation detector 3 includes a single SOI diode 3$a$. Along each row of thermal infrared radiation detecting pixels 5 horizontal select line 8 is arranged and along each column of thermal infrared radiation detecting pixels 5 vertical signal line 9 is arranged. Thus thermal infrared radiation detecting pixel 5 is electrically configured of nine SOI diodes connected between horizontal select line 8 and vertical signal line 9 in series. Note that although FIG. 7 does not show an interconnection for visible radiation detector 1 and the like, the remainder in configuration and operation to pick up an image is similar to that of the first embodiment.

In the third embodiment a single pixel of a visible image is configured by a single visible radiation detector 1 and a single pixel of a thermal infrared image is configured by nine infrared radiation detectors 3. As such, if each type of detector equal in number is arranged uniformly, the visible image will be nine times the thermal image in resolution. As such, when the present embodiment is compared with the first embodiment, the former can provide a further increased ratio in resolution between the visible image and the thermal infrared image. Furthermore, when a single pixel of a thermal infrared image that is formed of nine infrared radiation detectors 3 connected in series is compared with that formed of a single detector 3, the former allows infrared radiation to be received over an area per pixel nine times that of the latter. A thermal image further improved in temperature resolution can thus be provided.

Furthermore, infrared radiation detector 3 including SOI diode 3$a$ reduced in number can accordingly be reduced in size. Accordingly, visible radiation detector 1 can be arranged with a pitch reduced by the reduction in size of infrared radiation detector 3. This can provide a chip reduced in size, and hence an increased theoretical number of chips per wafer and reduced cost. Furthermore, increasing the number of detectors by the reduction of the pitch of the arrangement of visible radiation detector 1 allows a chip as a whole to provide an increased number of pixels and hence enhanced resolution. Furthermore visible radiation detector 1 can have its photoreceptive area increased by the reduction in size of infrared radiation detector 3 to be more sensitive.

Fourth Embodiment

Figure 8:
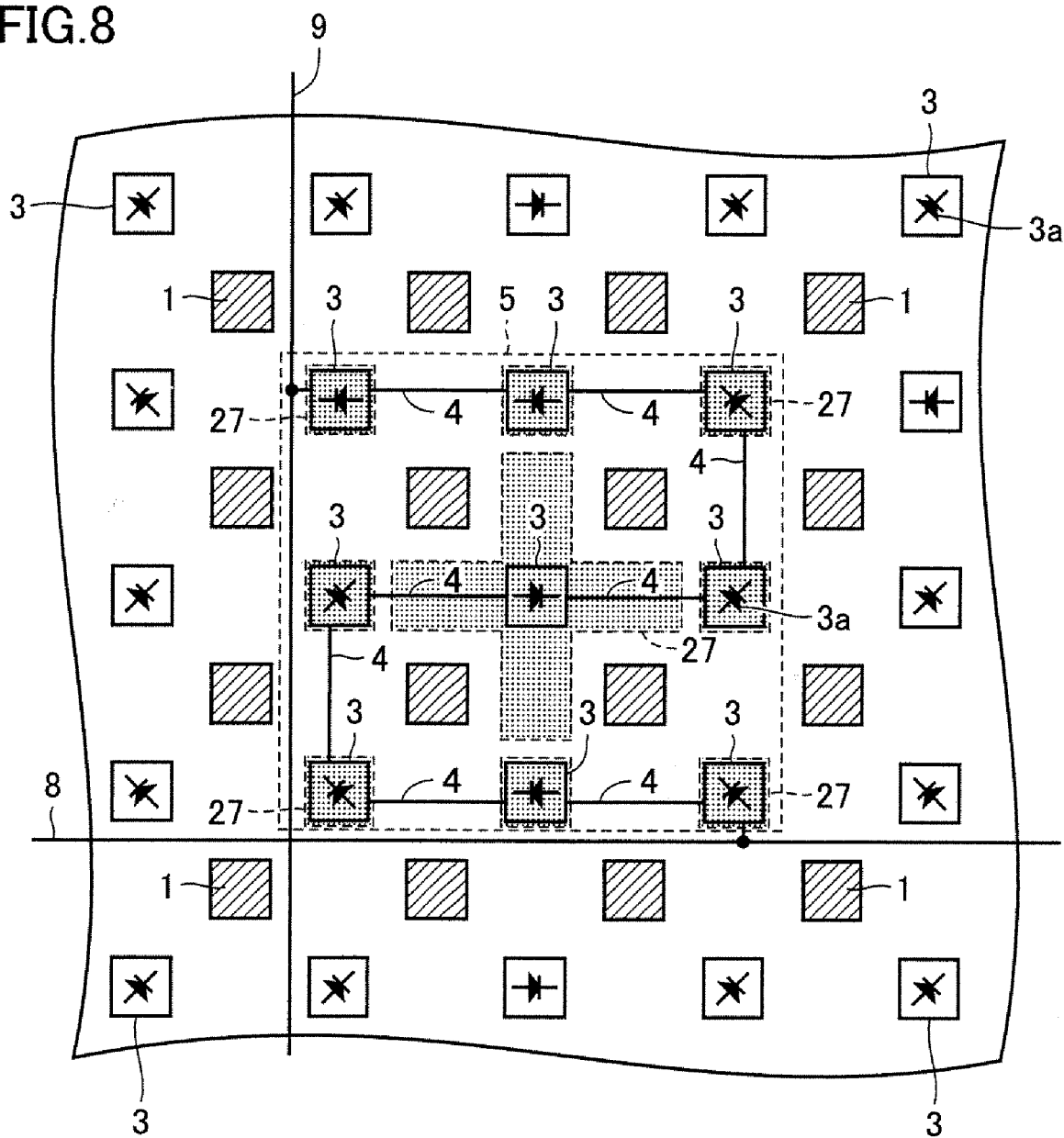

FIG. 8 is a plan view of a main portion of the present 2-wavelength image sensor in a fourth embodiment in comparison with FIG. 7. In FIG. 8, the 2-wavelength image sensor, as well as that of FIG. 7, includes thermal infrared radiation detecting pixel 5 formed of nine series connected infrared radiation detectors 3. Furthermore, the nine infrared radiation detectors 3 configuring thermal infrared radiation detecting pixel 5 are respectively provided with infrared radiation absorbing umbrella structures 27 independently. Note that the nine infrared radiation detectors 3 arranged in three rows and three columns have a centered infrared radiation detector 3 provided with infrared radiation absorbing umbrella structure 27 formed to be larger in area than that of another, peripheral infrared radiation detector 3. The remainder in configuration and operation to pick up an image is similar to that of the 2-wavelength image sensor described in the first embodiment.

In the fourth embodiment nine infrared radiation detectors 3 arranged in three rows and three columns have a centered infrared radiation detector 3 higher in sensitivity than peripheral detectors 3 and the sensitivity for detection in a single pixel will have a profile placing importance on the center of the pixel. This can improve the modulation transfer function (MTF) of a thermal image.

Fifth Embodiment

Figure 9:
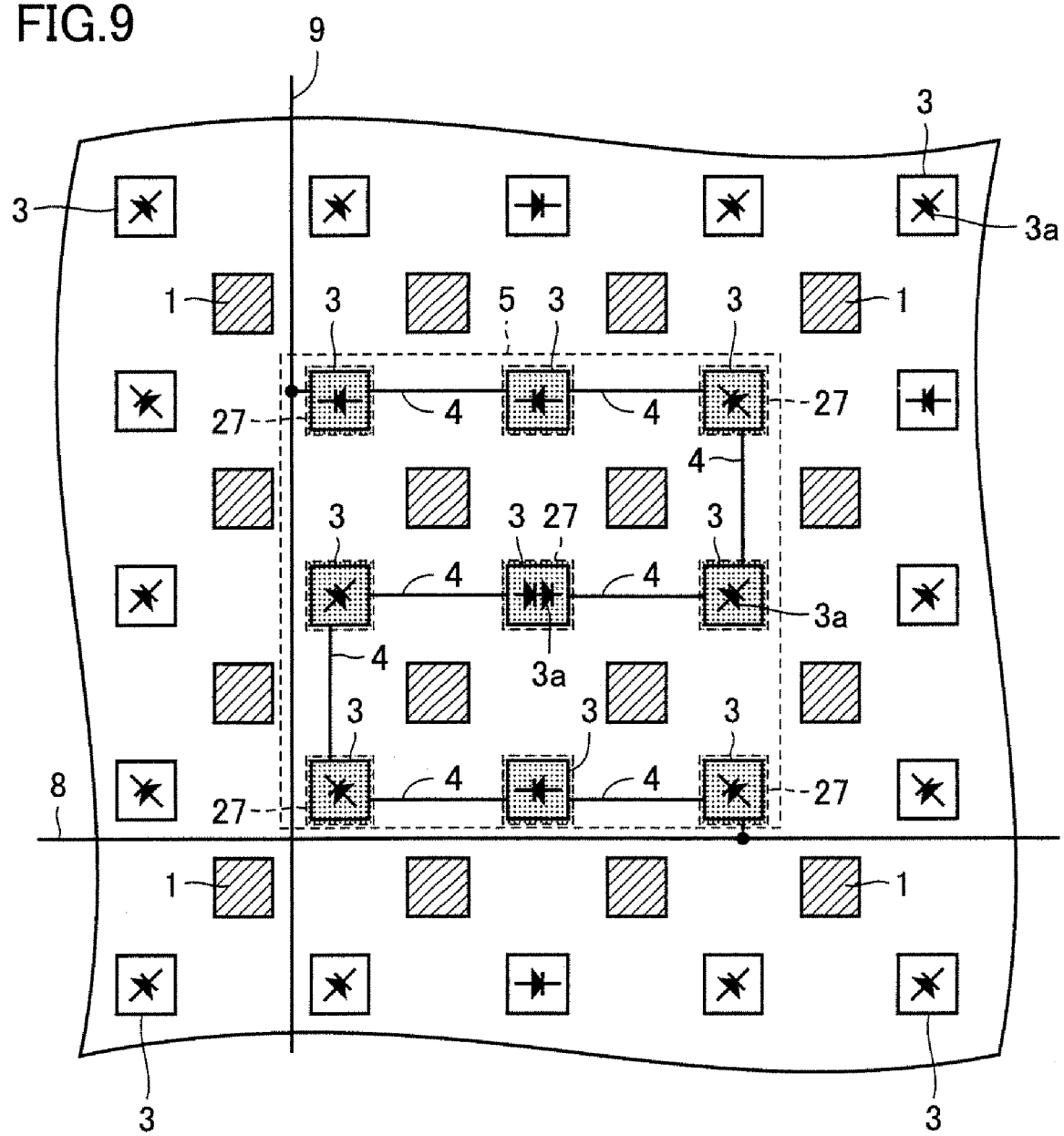

FIG. 9 is a plan view of a main portion of the present 2-wavelength image sensor in a fifth embodiment in comparison with FIG. 7. In FIG. 9, the 2-wavelength image sensor, as well as that of FIG. 7, includes thermal infrared radiation detecting pixel 5 formed of nine series connected infrared radiation detectors 3. Furthermore, the nine infrared radiation detectors 3 configuring thermal infrared radiation detecting pixel 5 are respectively provided with infrared radiation absorbing umbrella structures 27 independently. The infrared radiation absorbing umbrella structures 27 of the nine infrared radiation detectors 3 are equal in size. Note that the nine infrared radiation detectors 3 arranged in three rows and three columns have a centered infrared radiation detector 3 provided with two series connected SOI diodes 3$a$ and the other, peripheral infrared radiation detectors 3 each provided with a single SOI diode 3$a$. The remainder in configuration and operation to pick up an image is similar to that of the 2-wavelength image sensor described in the first embodiment.

In the fifth embodiment nine infrared radiation detectors 3 arranged in three rows and three columns have a centered infrared radiation detector 3 higher in sensitivity than peripheral detectors 3 and the sensitivity for detection in a single pixel will have a profile placing importance on the center of the pixel. This can improve the MTF of a thermal image.

Sixth Embodiment

Figure 10:
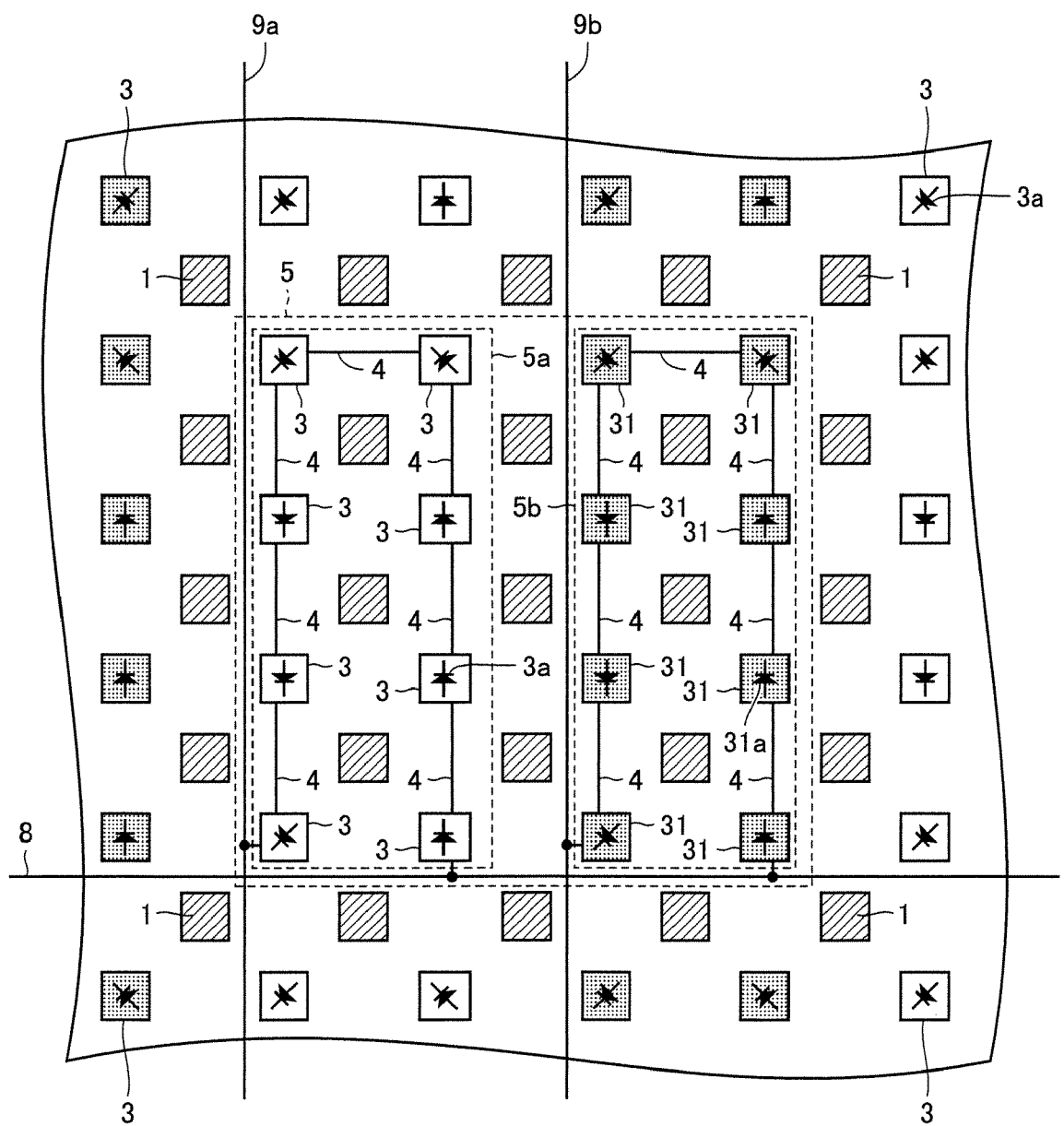

FIG. 10 is a plan view of a main portion of the present 2-wavelength image sensor in a sixth embodiment. In FIG. 10 the 2-wavelength image sensor has thermal infrared radiation detecting pixel 5 including an infrared radiation detection unit 5a for detecting thermal infrared radiation from an object to be shot and a substrate temperature detection unit 5b for detecting the temperature of a substrate. Along each row of thermal infrared radiation detecting pixel 5 horizontal select line 8 is provided. Along each column of infrared radiation detection units 5a a vertical signal line 9a is provided. Along each column of substrate temperature detection units 5b a vertical signal line 9b is provided.

Infrared radiation detection unit 5a is configured including eight uncooled infrared radiation detectors 3 arranged in four rows and two columns and seven metal interconnections 4 electrically connecting the eight infrared radiation detectors 3 in series. Each infrared radiation detector 3 is provided with a single SOI diode 3a. Infrared radiation detection unit 5a is electrically formed of eight SOI diodes 3a connected in series between horizontal select line 8 and vertical signal line 9a.

Similarly, substrate temperature detection unit 5b is configured including eight uncooled infrared radiation detectors 31 arranged in four rows and two columns and seven metal interconnections 4 electrically connecting the eight infrared radiation detectors 31 in series. Each infrared radiation detector 31 is provided with a single SOI diode 31a. Substrate temperature detection unit 5b is electrically formed of eight SOI diodes 31a connected in series between horizontal select line 8 and vertical signal line 9b.

Figure 11:
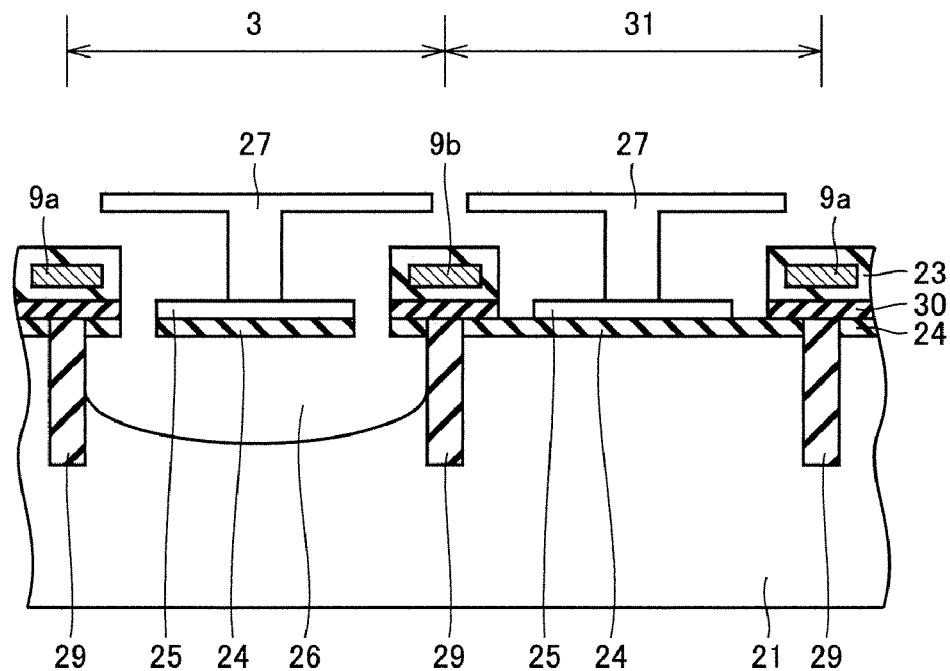
FIG. 11 is a cross section in configuration of two adjacent infrared radiation detectors shown in FIG. 10.

FIG. 11 is a cross section in configuration of adjacent infrared radiation detectors 3 and 31 for detecting thermal infrared radiation and the temperature of a substrate, respectively. In FIG. 11, infrared radiation detector 3 for detecting thermal infrared radiation has gap 26 formed by removing bulk silicon 21 underlying SOI layer 25 provided with SOI diode 3a. In contrast, infrared radiation detector 31 for detecting the temperature of the substrate does not have gap 26 formed under SOI layer 25 provided with SOI diode 31a. Infrared radiation detector 3 thus has a hollow, thermal insulation structure. Accordingly it outputs a potential varying with the amount of light incident and the temperature of the substrate. In contrast, infrared radiation detector 31 does not have a hollow, thermal insulation structure. Accordingly, it outputs a potential which does not vary with the amount of light incident but the temperature of the substrate alone.

Figure 12:
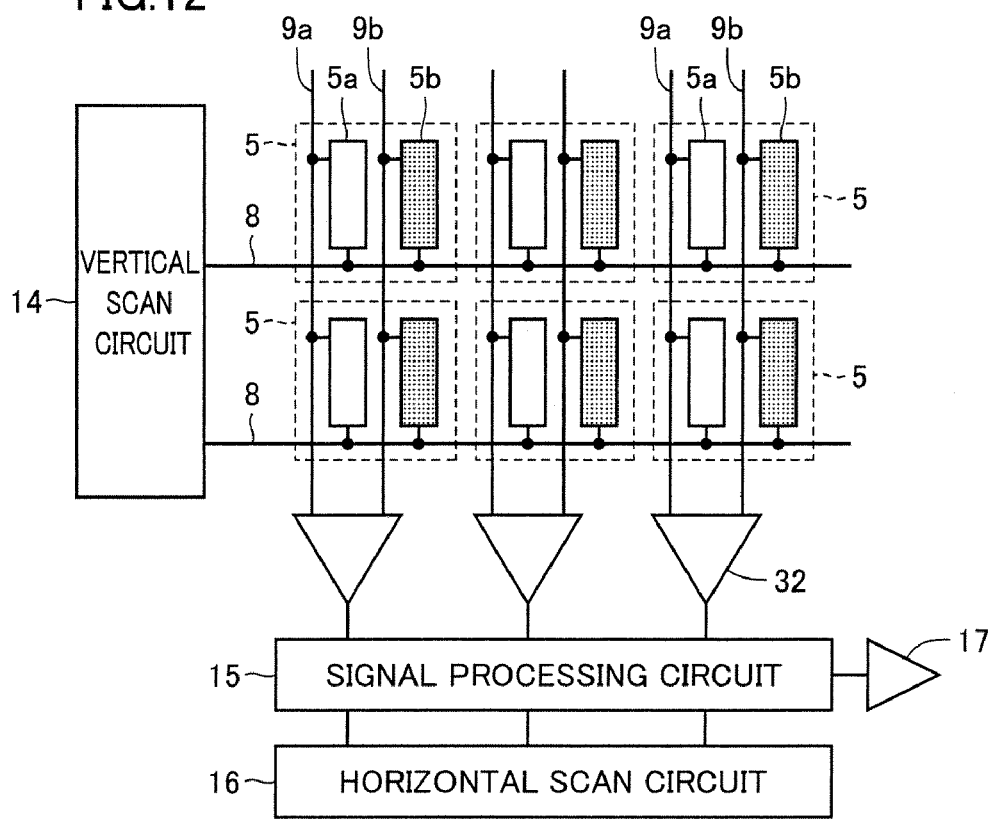
FIG. 12 is a block diagram showing a read circuit of the 2-wavelength image sensor shown in FIG. 10.

FIG. 12 is a block diagram of a read circuit of the 2-wavelength image sensor. In FIG. 12, a differential amplification circuit 32 is associated with each column of thermal infrared radiation detecting pixels 5. Each column has vertical signal lines 9a, 9b connected to differential amplification circuit 32 corresponding thereto. Differential amplification circuit 32 has an output end connected to signal processing circuit 15 configured of column amplifier group or the like and horizontal scan circuit 16. Furthermore, signal processing circuit 15 has an end connected to output amplifier 17 for infrared radiation. Differential amplification circuit 32 outputs a difference in potential between vertical signal lines 9a and 9b.

The 2-wavelength image sensor operates, as described hereinafter. In picking up a visible image it operates similarly as described in the first embodiment. In picking up a thermal infrared image it operates as described below: when the image sensor receives thermal infrared radiation, with infrared radiation detector 3 for detection of infrared radiation having a hollow, thermal insulation structure, the eight series connected infrared radiation detectors 3, or infrared radiation detection unit 5a, output a potential varying with the amount of light incident and the temperature of the substrate.

In contrast, infrared radiation detector 31 for detecting the temperature of the substrate does not have a hollow, thermal insulation structure, and the eight series connected infrared radiation detectors 31, or substrate temperature detection unit 5b, output a potential which does not vary with the amount of infrared radiation incident but the temperature of the substrate alone. Thus in an output of pixel 5 obtained by an operation of vertical scan circuit 14 and horizontal scan circuit 16 for selection appears only a variation in potential depending on the amount of infrared radiation incident thereon as differential amplification circuit 32 acts to cancel a variation of an output attributed to the temperature of the substrate. Except for this differential read, the operation performed to pick up a thermal image is similar to that described in the first embodiment.

In the sixth embodiment a single pixel of a visible image is configured by a single visible radiation detector 1 and a single pixel of a thermal infrared image is configured by 16 infrared radiation detectors. As such, if each type of detector equal in number is arranged uniformly, the visible image will be 16 times the thermal image in resolution. Furthermore, as the differential read allows the substrate's variation in temperature to be cancelled, a Peltier circuit or the like for controlling a device to be constant in temperature can be dispensed with, and a system reduced in size and cost can be provided.

Furthermore in an infrared image sensor employing an SOI diode as conventional an effect of the resistance of horizontal select line 8, vertical signal line 9 and the like depends on the coordinate on a two dimensional array. Accordingly the image sensor provides an output having a two dimensional offset profile. In the six embodiment, in contrast, infrared radiation detection unit 5a and substrate temperature detection unit 5b are adjacent and by a differential read the effect of the resistance of horizontal select line 8, vertical signal line 9 and the like can also be cancelled.

While in the sixth embodiment a hollow structure is absent to allow infrared radiation detector 31 for detecting the temperature of the substrate to be zero in sensitivity for detection for infrared radiation incident, the hollow structure may be held by a supporting leg sufficiently increased in thermal conductance to lower sensitivity for detection. In that case, not only a variation of an output attributed to the substrate's variation in temperature can be cancelled but an effect of a variation in temperature attributed to selfheat generation caused in passing a current through a pixel can also be reduced.

Note that while the first to sixth embodiments have been described with thermal infrared radiation detecting pixel 6 configured of four, nine or 16 infrared radiation detectors 3, any plurality thereof may be employed.

Furthermore while infrared radiation detector 3 is implemented by a uncooled detector that employs an SOI diode, an uncooled detector that employs a bolometer can similarly be discussed. The latter includes a bolometer having a value in resistance varying with the amount of infrared radiation incident. While in the fifth embodiment infrared radiation detecting pixel 5 has nine uncooled infrared radiation detection elements 3 with a centered infrared radiation detection element 3 having a larger number of SOI diodes 3a than those of the peripheral infrared radiation detection elements 3, infrared radiation detecting pixel 5 having nine uncooled infrared radiation detection elements 3 with a centered infrared radiation detection element 3 including a bolometer having a value in resistance larger than those in resistance of the bolometers of the peripheral infrared radiation detection elements 3 is similarly effective.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A 2-wavelength image sensor picking up both a visible image and an infrared image, comprising a detector array including a plurality of visible radiation detectors and a plurality of uncooled infrared radiation detectors, said plurality of visible radiation detectors and said plurality of uncooled infrared radiation detectors being uniformly dispersedly arranged, wherein:
    each of said visible radiation detectors configures a single pixel of said visible image; and
    said plurality of uncooled infrared radiation detectors are divided into groups of N of said uncooled infrared radiation detectors, N being an integer of at least two, each of said groups having said N of said uncooled infrared radiation detectors electrically series connected to configure a single pixel of said infrared image.

2. The 2-wavelength image sensor according to claim 1, wherein each of said uncooled infrared radiation detectors employs an SOI diode.

3. The 2-wavelength image sensor according to claim 2, wherein:
    each of said uncooled infrared radiation detectors includes series connected one or at least two SOI diodes; and
    each of said groups has said N of said uncooled infrared radiation detectors with a centered uncooled infrared radiation detector having a larger number of SOI diodes than that of SOI diode of another one of said N of said uncooled infrared radiation detectors of said each of said groups.

4. The 2-wavelength image sensor according to claim 1, wherein each of said uncooled infrared radiation detectors employs a bolometer.

5. The 2-wavelength image sensor according to claim 4, wherein:
    each of said uncooled infrared radiation detectors includes a bolometer; and
    each of said groups has said N of said uncooled infrared radiation detectors with a centered uncooled infrared radiation detector including said bolometer having a larger value in resistance than that of said bolometer of another one of said N of said uncooled infrared radiation detectors of said each of said groups.

6. The 2-wavelength image sensor according to claim 1, wherein:
    each of said uncooled infrared radiation detectors includes an infrared radiation absorbing umbrella structure; and
    each of said groups has said N of said uncooled infrared radiation detectors with their respective infrared radiation absorbing umbrella structures thermally coupled together.

7. The 2-wavelength image sensor according to claim 1, wherein:
    each of said uncooled infrared radiation detectors includes an infrared radiation absorbing umbrella structure;
    each said infrared radiation absorbing umbrella structure is thermally independent from another infrared radiation absorbing umbrella structure; and
    each of said groups has said N of said uncooled infrared radiation detectors with a centered uncooled infrared radiation detector including said infrared radiation absorbing umbrella structure larger in area than said infrared radiation absorbing umbrella structure of another one of said N of said uncooled infrared radiation detectors of said each of said groups.

8. A 2-wavelength image sensor picking up both a visible image and an infrared image, comprising:
    a detector array including a plurality of visible radiation detectors and a plurality of uncooled infrared radiation detectors, said plurality of visible radiation detectors and said plurality of uncooled infrared radiation detectors being uniformly dispersedly arranged, wherein
    each of said visible radiation detectors configures a single pixel of said visible image,
    said plurality of uncooled infrared radiation detectors are divided into groups of 2N of said uncooled infrared radiation detectors, N being an integer of at least two, each of said groups configuring a single pixel of said infrared image, and
    each of said groups has said 2N of said uncooled infrared radiation detectors divided into first and second subgroups each formed of N of said 2N of said uncooled infrared radiation detectors, said first subgroup having said N of said 2N of said uncooled infrared radiation detectors series connected to configure an infrared radiation detection unit, said second subgroup having said N of said 2N of said uncooled infrared radiation detectors series connected to configure a substrate temperature detection unit, said uncooled infrared radiation detectors of said first subgroup detecting infrared radiation with higher sensitivity than said uncooled infrared radiation detectors of said second subgroup; and
    a subtraction circuit subtracting a level of a signal output from said substrate temperature detection unit from that of a signal output from said infrared radiation detection unit to generate a signal output from a pixel corresponding thereto.

9. The 2-wavelength image sensor according to claim 8, wherein said uncooled infrared radiation detectors of said first subgroup have a hollow, thermal insulation structure and said uncooled infrared radiation detectors of said second subgroup do not have a hollow, thermal insulation structure to allow said uncooled infrared radiation detectors of said first subgroup to detect infrared radiation with higher sensitivity than said uncooled infrared radiation detectors of said second subgroup.

10. The 2-wavelength image sensor according to claim 8, wherein each of said uncooled infrared radiation detectors has a hollow, thermal insulation structure and said uncooled infrared radiation detectors of said first subgroup have a supporting leg smaller in thermal conductance than that of said uncooled infrared radiation detectors of said second subgroup to allow said uncooled infrared radiation detectors of said first subgroup to detect infrared radiation with higher sensitivity than said uncooled infrared radiation detectors of said second subgroup.

* * * * *